United States Patent [19]

Inomata et al.

[11] Patent Number: 5,585,196

[45] Date of Patent: Dec. 17, 1996

[54] MAGNETORESISTANCE EFFECT ELEMENT

[75] Inventors: Koichiro Inomata; Yoshinori Takahashi, both of Yokohama; Shiho Okuno, Fujisawa; Yoshiaki Saito, Kawasaki; Keiichiro Yusu, Yokohama, all of Japan

[73] Assignee: Kabushiki Kaisha Toshiba, Kawasaki, Japan

[21] Appl. No.: 208,600

[22] Filed: Mar. 11, 1994

[30] Foreign Application Priority Data

Mar. 12, 1993 [JP] Japan .................................. 5-052754

[51] Int. Cl.$^6$ ............................. G11B 5/127; G11B 5/66; G11B 5/70; H01F 1/00
[52] U.S. Cl. ........................ 428/557; 360/113; 360/126; 428/558; 428/561; 428/611; 428/615; 428/671; 428/675; 428/336; 428/402; 428/692; 428/693; 428/694 R; 428/694 T; 428/900
[58] Field of Search ............................ 148/305; 324/252; 338/32 R; 360/113, 126; 428/546, 557, 558, 561, 655, 671, 611, 675, 928, 693, 694 R, 694 T, 692, 900, 551, 336, 402, 553, 615, 674

[56] References Cited

U.S. PATENT DOCUMENTS

| 3,350,180 | 10/1967 | Croll ......................................... 428/635 |
| 5,206,590 | 4/1993 | Dieny et al. ............................... 324/252 |
| 5,268,043 | 12/1993 | McCowen ................................. 148/310 |
| 5,304,975 | 4/1994 | Saito et al. ............................... 338/32 R |
| 5,523,172 | 6/1996 | Saito et al. ............................... 428/611 |

FOREIGN PATENT DOCUMENTS

| 0483373 | 5/1992 | European Pat. Off. . |
| 0498668 | 8/1992 | European Pat. Off. . |
| 0503499 | 9/1992 | European Pat. Off. . |
| 4-137572 | 5/1992 | Japan . |
| 4-218982 | 8/1992 | Japan . |

OTHER PUBLICATIONS

S.S.P. Parkin et al., "Giant Magnetoresistance in antiferromagnetic Co/Cu multilayers," Appl. Phys. Lett., vol. 58, No. 23, Jun. 10, 1991, pp. 2710–2712.
A. E. Berkowitz et al., "Giant Magnetoresistance in Heterogeneous Cu—Co Alloys," Physical Review Letters, vol. 68, No. 25, Jun. 22, 1992, pp. 3745–3748.
J. Q. Xiao et al., "Giant Magnetoresistance in Nonmultilayer Magnetic Systems," Physical Review Letters, vol. 68, No. 25, Jun. 22, 1992, pp. 3749–3752.
M. Jimbo et al., "Giant Magnetoresistance in FeNiCo/Cu Multilayers," Jpn. J. Appl. Phys., vol. 31, No. 9B, Sep. 15, 1992, pp. L1348–50.
Copy and Translation of German Official Action dated Jul. 26, 1995.
"Giant Magnetoresistance at Low Fields in Discontinuous NiFe—Aq Multilayer Thin Films" T. L. Hylton, et al., Science, vol. 261 (Aug. 20, 1993).
"Giant Magnetoresistance in Heterogeneous Cu—Co Alloys", A. E. Berkowitz et al., Physical Review Letters, vol. 68, No. 25, Jun. 22, 1992.
"Giant magnetoresistance in the qranular Co—Aq system", J. Q. Xiao, et al., Physical Review B, vol. 46, No. 14, Oct. 1, 1992.
"Oscillatory interlayer coupling and giant magnetoresistance in Co/Cu multilayers", Jrnl. of Magnetism and Magnetic Materials 94 (1991) L1–L5.
"Giant Magnetoresistance of (001) Fe/(001)Cr Magnetic Superlattices", M. N. Baibich, et al., Physical Review Letters, vol. 61, No. 21, (11/21/88).

Primary Examiner—Paul J. Thibodeau
Assistant Examiner—Stephen Sand
Attorney, Agent, or Firm—Finnegan, Henderson, Farabow, Garrett & Dunner, L.L.P.

[57] ABSTRACT

There is disclosed a magnetoresistance effect element including a multilayer constituted by a magnetic layers in which fine magnetic metal particles of crystalline or amorphous containing at least one element of Fe, Co, and Ni are dispersed in a matrix containing at least one element selected from the group consisting of noble metals and Cu, and non-magnetic layers containing a noble metal.

34 Claims, 8 Drawing Sheets

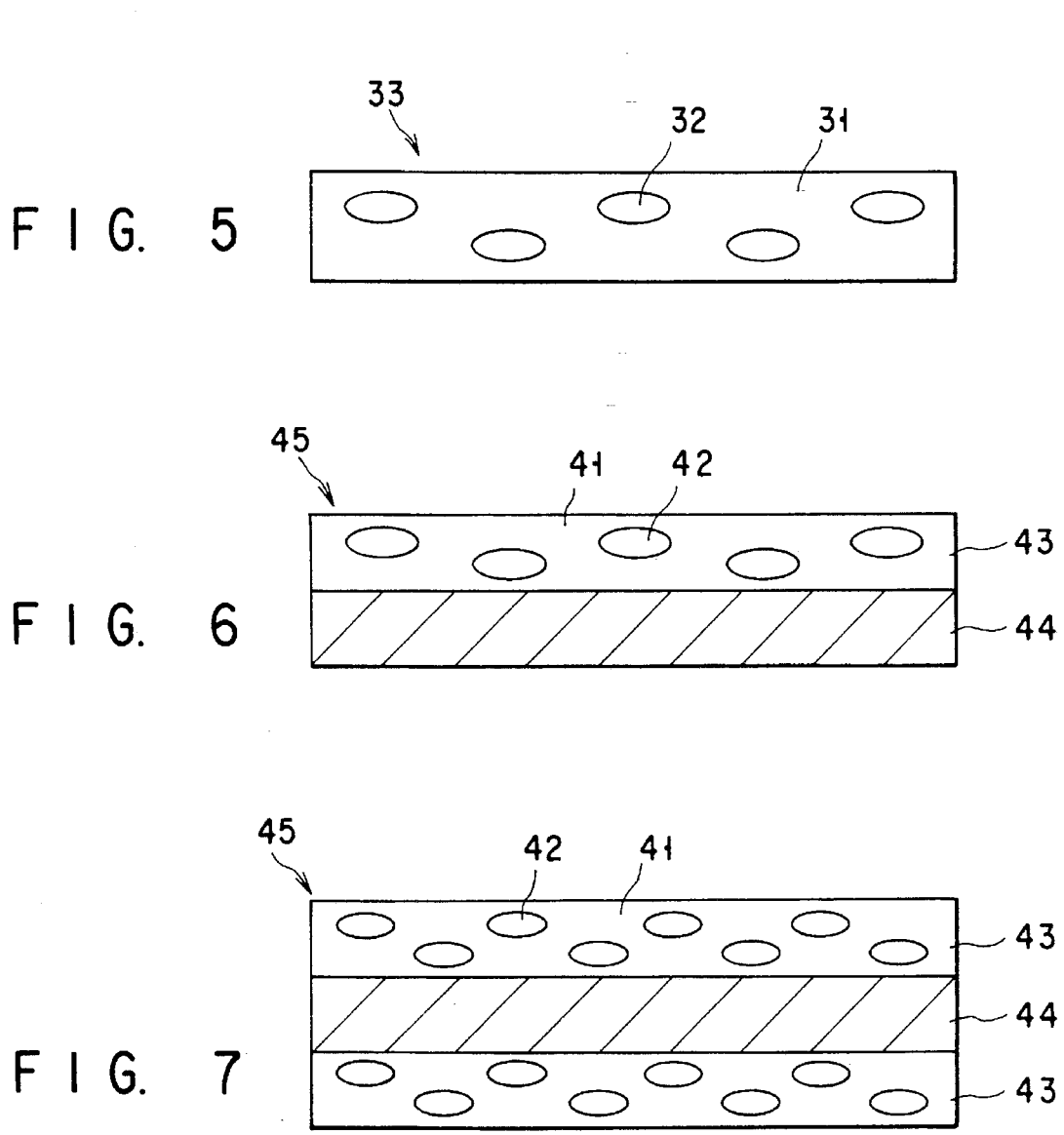

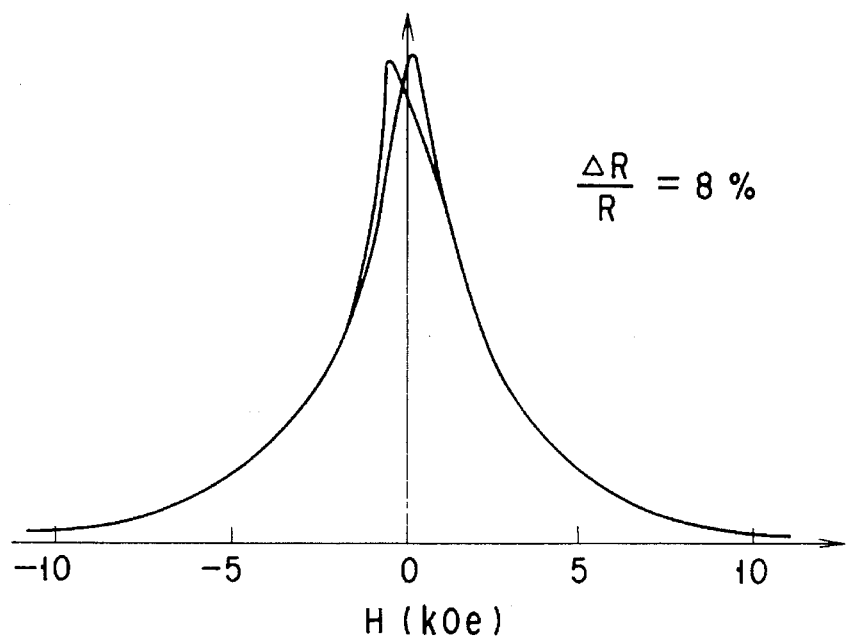
F I G. 15
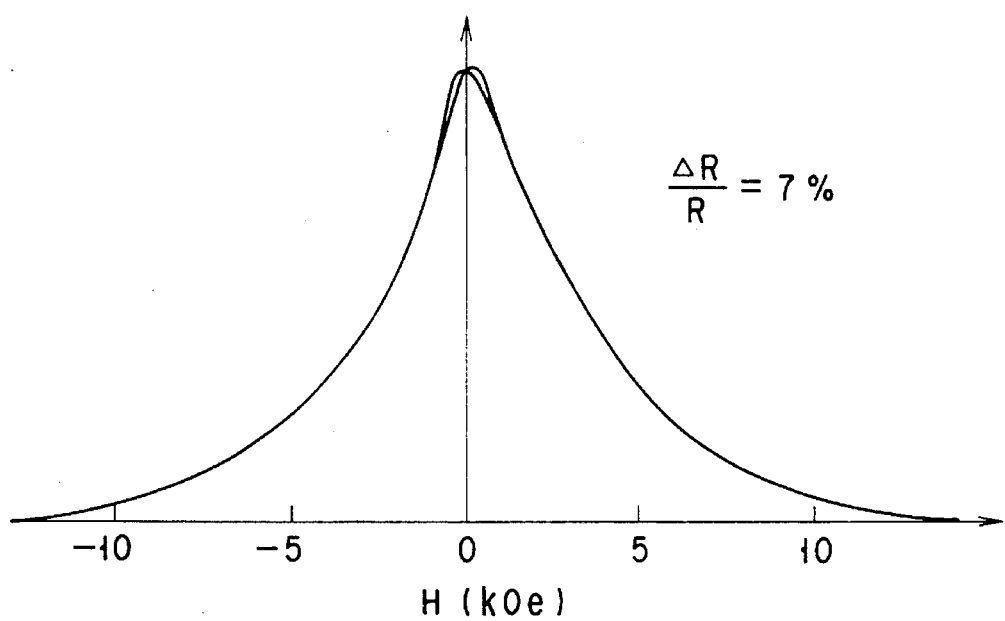
F I G. 16

MAGNETORESISTANCE EFFECT ELEMENT

BACKGROUND OF THE INVENTION

1. Field of the Invention

The present invention relates to a magnetoresistance effect element using a magnetic layer having a non-magnetic metal matrix and fine magnetic particles dispersed in the matrix.

2. Description of the Related Art

A magnetoresistance effect element using a magnetoresistance effect is popularly used as a magnetic field sensor or a magnetic head. The magnetoresistance effect element formed by using a ferromagnetic material has excellent temperature stability and a wide temperature range in which the ferromagnetic material can be used. Conventionally, a permalloy thin film having a magnetoresistance ratio of about 2% is popularly used as the material of a magnetoresistance effect element using a magnetic material. However, the magnetoresistance ratio of the permalloy thin film is too small to obtain a sufficient sensitivity.

In contrast to this, in recent years, an artificial lattice film having a structure in which magnetic layers and non-magnetic layers are alternately stacked at a period of several Å to several tens Å and upper and lower magnetic layers are antiparallel-magnetically coupled to each other through a non-magnetic metal layer has received a great deal of attraction due to its great magnetoresistance effect. An artificial lattice film such as an $(Fe/Cr)_n$ film (Phys. Rev. Lett., Vol. 61, p. 2,472 (1988)) or a $(Co/Cu)_n$ film (J. Mag. Mag. Mat., Vol. 94, pL1 (1991)) has been developed. The great magnetoresistance effect is obtained scattering electrons depending on a spin direction of the magnetic layer.

It is most recently found that not only a multilayer but also a film having a Cu or Ag matrix and Co or Fe fine magnetic particles dispersed in the matrix has a large magnetoresistance effect (Phys. Rev. Lett. 68, 3749 (1992), Phys. Rev. Lett., 68, 3745 (1992), Phys. Rev., 46, 9266 (1992)).

The film in which the fine magnetic particles are dispersed can be easily formed compared with an artificial lattice film, and has an large MR ratio of about 20%. In addition, since the fine particles have small sizes and a single domain, an MR curve has no hysteresis. Therefore, when the film is used as a magnetoresistance effect element, it is expected that the magnetoresistance effect element has low Barkhausen noise. However, since a large magnetic field of 10 kOe or more must be applied to obtain a large MR ratio, this large magnetic field poses a problem in practical use.

SUMMARY OF THE INVENTION

The present invention has been made in consideration of the above circumstances, and has as its object to provide a magnetoresistance effect element having small hysteresis, a small saturation magnetic field, a large magnetoresistance ratio, in which a large magnetoresistance ratio in a small magnetic field can be obtained.

According to the first aspect of the present invention, there is provided a magnetoresistance effect element comprising a magnetic layer in which fine amorphous magnetic metal particles containing at least one element selected from the group consisting of Fe, Co, and Ni are dispersed in a matrix containing at least one element selected from the group consisting of noble metals and Cu.

According to the second aspect of the present invention, there is provided a magnetoresistance effect element comprising a multilayer constituted by magnetic layers in which fine magnetic metal particles containing at least one element selected from the group consisting of Fe, Co, and Ni are dispersed in a matrix containing at least one element selected from the group consisting of noble metals and Cu, and a non-magnetic layers containing a noble metal.

According to the third aspect of the present invention, there is provided a magnetoresistance effect element comprising a multilayer constituted by first magnetic layers in which fine magnetic metal particles containing at least one element selected from the group consisting of Fe, Co, and Ni are dispersed in a matrix containing at least one element selected from the group consisting of noble metals and Cu, and second magnetic layers containing at least one element selected from the group consisting of Fe, Co, and Ni.

According to the fourth aspect of the present invention, there is provided a magnetoresistance effect element comprising a magnetic layer in which fine magnetic particles having a uniaxial magnetic anisotropy and a major axis of not more than 200 Å are dispersed in a non-magnetic metal matrix.

According to the fifth aspect of the present invention, there is provided a magnetoresistance effect element comprising a multilayer constituted by a first magnetic layer in which fine magnetic particles are dispersed in a non-magnetic metal matrix, and a second magnetic layer having magnetic properties softer than that of the first magnetic layer.

According to the sixth aspect of the present invention, there is provided a magnetoresistance effect element comprising a magnetic layer in which fine magnetic particles formed of at least two magnetic elements selected from the group consisting of Fe, Co, and Ni are dispersed in a non-magnetic metal matrix.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross-sectional view showing a magnetoresistance effect element according to the third embodiment of the present invention;

FIG. 5 is a cross-sectional view showing a magnetoresistance effect element according to the fourth embodiment of the present invention;

FIG. 6 is a cross-sectional view showing a magnetoresistance effect element according to the fifth embodiment of the present invention;

FIGS. 7 and 8 are cross-sectional views showing another magnetoresistance effect element according to the fifth embodiment of the present invention;

FIG. 15 is a graph showing the magnetoresistance ratio of a sample of a magnetoresistance effect element according to Example 11;

FIG. 16 is a graph showing the magnetoresistance ratio of a sample of a magnetoresistance effect element used as a comparative example in Example 11;

DETAILED DESCRIPTION OF THE PREFERRED EMBODIMENTS

The present invention will be described below in detail.

Figure 1:
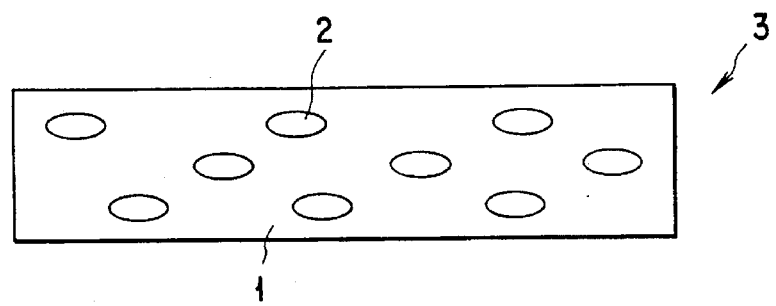
FIG. 1 is a cross-sectional view showing a magnetoresistance effect element according to the first embodiment of the present invention.

A magnetoresistance effect element according to the first embodiment of the present invention, as shown in FIG. 1, has a magnetic layer 3 in which fine amorphous magnetic metal particles 2 containing at least one element of Fe, Co, and Ni are dispersed in matrix 1 containing at least one element selected from the group consisting of noble metals and Cu.

A conventional film in which fine magnetic metal particles are dispersed in a noble metal matrix has a large saturation magnetic field due to the following reason. Large magnetic anisotropy may be induced in the dispersed fine particles, and the fine particles may be so small to exhibit superparmagnetic behavior and distributed at random.

This magnetic anisotropy may be caused by magnetoelastic energy generated by coupling a magnetocrystalline anisotropy or the magnetostriction of the fine particles to internal stress and a shape anisotropy based on the shapes of the fine particles. Therefore, when these magnetic anisotropies are reduced, a saturation magnetic field can be decreased.

In this embodiment, in order to reduce the magnetocrystalline anisotropy, the fine magnetic metal particles are formed of an amorphous material. This is because the magnetocrystalline anisotropy of the amorphous alloy is essentially zero.

As an element constituting the matrix 1, non-ferromagnetic metal elements such as Cu, Ag, and Au may be used singly or in the form of an alloy containing at least one of these element.

The fine amorphous magnetic metal particles 2 contain at least one element of Fe, Co, and Ni and exhibit ferromagnetism. As described above, the fine amorphous magnetic metal particles are preferably used, and an amorphous alloy whose magnetostriction is essentially zero is more preferably used as the fine magnetic metal particles because magnetic anisotropy based on magnetoelasticity decreases. As an amorphous magnetic material whose magnetostriction is essentially zero, a magnetic material having a composition represented by $(Ni_xFe_yCo_z)_aX_{100-a}$ (where $x=0-0.10$, $y=0.04-0.10$, $z=0.90-0.94 x+y+z=1$, $a=65-90$, and X is at least one of the element selected from the group consisting of Nb, Zr Hf, Si, B, C and P.) is also known.

In order to decrease the magnetic anisotropy of the fine magnetic metal particles 2, flat shaped particles are preferably used as the fine particles 2, and an aspect ratio is preferably set to be about 5 to 50.

In order to increase a magnetoresistance ratio, the volume of the fine magnetic metal particles themselves is preferably reduced. More specifically, the major axis of each fine particle is preferably 50 to 200 Å.

Note that, the layer constituted by the matrix and the fine magnetic metal particles is a magnetic layer as a whole.

The magnetic layer described above typically has a thin-film structure, and the magnetic layer can be formed by a thin-film formation technique such as a molecular beam epitaxy (MBE) method or an ultra-high vacuum sputter method using an ultra-high vacuum. The magnetic layer can also be formed by a conventional thin-film formation technique such as an RF magnetron sputter method, an ion beam sputter method, or a deposition method in which a degree of initial vacuum is set to be $10^{-7}$ Torr or less (i.e., a pressure is $10^{-7}$ Torr or more). In addition, the shape of the magnetic layer is not limited to the thin-film shape, and a ribbon obtained by rapid quenching or the like may be used as the magnetic layer.

The second embodiment of the present invention will be described below.

Figure 2:
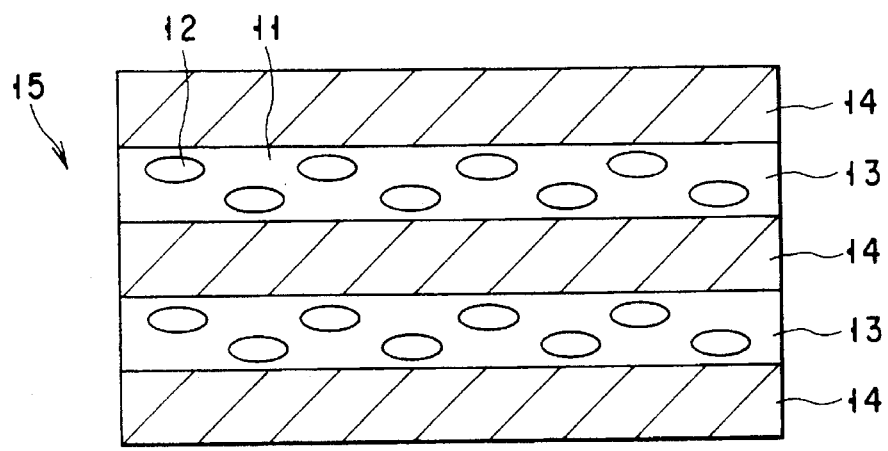
FIG. 2 is a cross-sectional view showing a magnetoresistance effect element according to the second embodiment of the present invention.

A magnetoresistance effect element according to the second embodiment of the present invention, as shown in FIG. 2, has a multilayer 15 constituted by magnetic layers 13 in which fine crystalline or amorphous magnetic metal particles 12 containing at least one element of Co, Fe, and Ni are dispersed in matrix 11 containing at least one element selected from the group consisting of noble metals and Cu, and non-magnetic layers 14 containing a noble metal.

When the multilayer described above is formed, a saturation magnetic field can be reduced due to the following reason. That is, in the multilayer, the shape of each of the fine magnetic metal particles dispersed in the matrix becomes flat, thereby decreasing the shape anisotropy of the particles.

Figure 3:
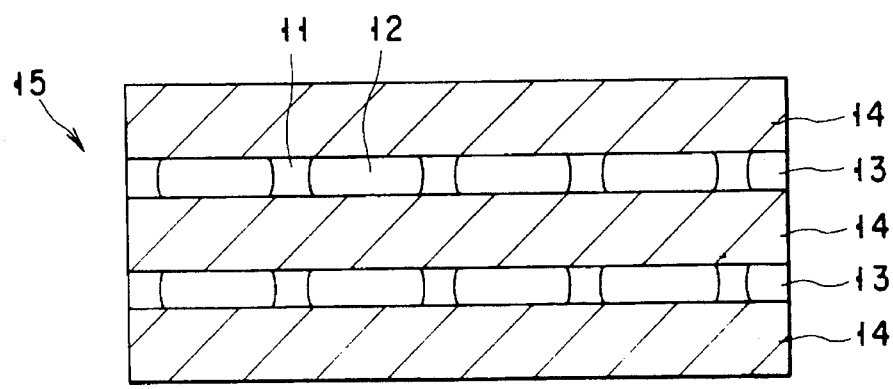
FIG. 3 is a cross-sectional view showing a preferable magnetoresistance effect element according to the second embodiment of the present invention.

In this case, as the fine magnetic metal particles 12, not only fine amorphous particles but also fine crystalline particles can be used. In addition, as in the first embodiment, in order to increase the magnetoresistance ratio, the volume of the fine magnetic metal particles themselves is preferably reduced, and the major axis of each particle is preferably 50 to 200 Å. In this embodiment, the fine magnetic metal particles 12 preferably have zero magnetostriction, and a crystalline permalloy or an amorphous alloy having the composition of $(Ni_xFe_yCo_z)_aX_{100-a}$ described above can be used as the alloy for the fine magnetic metal particles 12. The fine magnetic metal particles 12 preferably have a uniaxial magnetic anisotropy. In this case, in order to introduce the uniaxial magnetic anisotropy, the same methods as the methods employed in the fourth embodiment (to be described later) can be used. As shown in FIG. 3, the fine magnetic metal particles 12 preferably have a thickness which is almost equal to that of the magnetic layer, and are preferably arranged along the in-plane direction of the magnetic layer 13.

In this embodiment, matrix 11 containing at least one element selected from the group consisting of noble metals and Cu is formed in the same manner as described in the first embodiment. The non-magnetic layer 14, containing a metal, to be stacked on the magnetic layer 13 is formed of a metal element such as Cu, or a noble element such as Ag, or Au having non-ferromagnetism or an alloy containing at least one of these elements, like the matrix 11. The magnetic layers 13 adjacent to each other through the non-magnetic layer 14 are preferably magnetostatically coupled to each other.

The multilayer 15 typically has a thin-film structure, and, as described above, can be formed using the thin film formation technique described above. The multilayer 15 may be constituted by a ribbon formed by rapid quenching. The multilayer 15 may be formed such that magnetic layers each having a matrix containing at least one element selected from the group consisting of noble metal and Cu in which fine magnetic metal particles are dispersed, and non-magnetic layers containing a noble metal are alternately formed. The multilayer 15 can also be formed such that magnetic layers each formed of at least one element of Co, Fe, and Ni and the non-magnetic layers 14 are alternately stacked and then annealed to diffuse the metal element in the magnetic layer.

Note that the layers constituting the multilayer need not have the same composition and the same thickness. The thickness of the magnetic layer is preferably set to be 5 to 200 Å, and the thickness of the non-magnetic layer is preferably set to be 10 to 100 Å. Although the number of layers is not limited to the number of the above embodiment, the number of layers is preferably set to be about 5 to 50.

When the magnetoresistance element is formed of the multilayer as described above, not only an effect of reducing a saturation magnetic field is obtained as described above, but also a magnetoresistance ratio itself can also be increased.

The third embodiment will be described below. A magnetoresistance effect element according to the third embodiment of the present invention, as shown in FIG. 4, has a multilayer 25 constituted by a first magnetic layers 23 in which fine crystalline or amorphous magnetic metal particles 22 containing at least one element of Co, Fe, and Ni are dispersed in matrix 21 containing at least one element selected from the group consisting of noble metals and Cu and a second magnetic layers 24 containing at least one element of Fe, Co, and Ni.

When the multilayer is formed as described above, the shape of each of the fine magnetic metal particles dispersed in the matrix becomes flat to decrease a shape anisotropy, as in the second embodiment. As a result, a saturation magnetic field can be reduced.

In this case, each of the fine magnetic metal particles 22 in the first magnetic layer 23, as in the above embodiment, preferably has a major axis of 50 to 200 Å. In this embodiment, the fine magnetic metal particles preferably have zero magnetostriction, and crystalline permalloy or an alloy having the composition of $(Ni_xFe_yCo_z)_aX_{100-a}$ described above can be used as the alloy for the fine magnetic metal particles 22.

In this embodiment, the matrix 21 in the first magnetic layer 23 is formed in the same manner as in the second embodiment. The second magnetic layer 24 to be stacked on the first magnetic layer 23 in which the fine magnetic metal particles 22 are dispersed contains at least one element of Fe, Co, and Ni and exhibits ferromagnetism.

Note that the first magnetic layers and second magnetic layers constituting the multilayer 25 need not have the same composition and the same thickness, respectively. The thickness of the first magnetic layer 23 is preferably set to be 5 to 200 Å, and the thickness of the second magnetic layer 24 is preferably set to be 20 to 300 Å. Although the number of layers is not limited to a specific value, the number of layers is preferably set to be about 5 to 50.

The magnetoresistance effect element of this embodiment can be manufactured in the same manner as in the second embodiment.

The fourth embodiment will be described below.

A magnetoresistance effect element according to the fourth embodiment of the present invention, as shown in FIG. 5, has a magnetic layer 33 in which fine magnetic particles 32 having a uniaxial magnetic anisotropy and a major axis of 200 Å or less are dispersed in a non-magnetic metal matrix 31.

In this embodiment, since the fine magnetic particles 32 in the non-magnetic metal matrix 31 have a uniaxial magnetic anisotropy, a magnetoresistance effect element having a small saturation magnetic field can be realized. That is, when the fine magnetic particles 32 have the uniaxial magnetic anisotropy, a large saturation magnetic field caused by a random magnetic anisotropy is not generated, and a small saturation magnetic field can be obtained. In this case, the fine magnetic particles 32 each having a major axis of 200 Å or less are used.

In this embodiment, as the material of the non-magnetic metal matrix 31, a non-ferromagnetic material which exhibits a magnetoresistance effect is preferably used. The non-ferromagnetic material which is formed of a non-magnetic element such as Mo, Nb, or Al or an alloy containing at least one of these elements may be used as the material of the non-magnetic metal matrix 31. A metal element such as Cu, or a noble element such as Au, or Ag or an alloy containing at least one of these elements is preferably used. The matrix is a monocrystalline or polycrystalline film.

As the material of the fine magnetic particles 32, a ferromagnetic element such as Fe, Co, or Ni or a ferromagnetic alloy containing at least one of these elements is used. These fine particles partially or entirely keep lattice matching with the matrix 31. Although the major axis of each of the fine magnetic particles 32 is 200 Å or less, each of the fine particles preferably has a major axis of 50 Å or more because the major axis is too small to obtain a desired effect.

As the entire shape of the magnetic layer, a thin-film structure formed on a substrate, a ribbon obtained by a rapid quenching method, and a linear shape is preferably selected.

In this embodiment, the fine magnetic particles 32 constituting the magnetoresistance effect element has a uniaxial magnetic anisotropy in a predetermined direction parallel to the in-plane direction. As a method of defining the uniaxial magnetic anisotropy in the predetermined direction, the following methods are used.

When a film is epitaxially grown on a monocrystalline substrate having a surface of twofold symmetrys surface, e.g., on an MgO (110), an axis of easy magnetization can be defined in a predetermined direction parallel to the surface of the substrate by the reverse effect of magnetostriction caused by distortion which is a characteristic feature of a heteroepitaxial film or a magnetocrystalline anisotropy effect inherent in the monocrystalline film. Therefore, the uniaxial magnetic anisotropy can be introduced.

After the film or wire is formed, when the resultant structure is annealed in a magnetic field of 10 Oe to 10 kOe, the uniaxial magnetic anisotropy can be introduced.

In addition, when a thin film is formed in a magnetic field applied parallel to the in-plane direction, a uniaxial magnetic anisotropy can be introduced.

In the thin film according to this embodiment, the maximum electrical resistance can be obtained when a magnetic field is close to zero, and the minimum electrical resistance can be obtained when a magnetic field is applied such that the directions of magnetization of the fine particles are completely aligned with each other. At this time, when a magnetoresistance ratio is measured such that an axis of easy magnetization is set to be parallel to the direction of application of the magnetic field, a change in magnetoresistance becomes sensitive with respect to a magnetic field to improve the sensitivity.

The above magnetic layer typically has a thin-film structure, and can be formed using the same thin-film formation technique as in the first and second embodiments. In addition, the magnetic layer may be constituted by a ribbon formed by rapid quenching.

According to the fifth embodiment of the present invention, a magnetoresistance effect element has a multilayer 45 constituted by a first magnetic layer 43 in which fine magnetic particles 42 are dispersed in a non-magnetic metal matrix 41 and a second magnetic layer 44 having magnetism softer than that of the first magnetic layer.

This embodiment is based on the following findings of the present inventors. That is, when a magnetic layer having softer magnetism is stacked on a magnetic layer in which fine magnetic particles are dispersed, i.e., a so-called granular layer, a saturation magnetic field can be reduced while a sufficient magnetoresistance ratio is maintained.

In this case, the fine magnetic particles 42 in the first magnetic layer 43 consist of a ferromagnetic element such as Fe, Co, or Ni or a ferromagnetic alloy containing at least one of these elements. As the material of the non-magnetic metal matrix, a non-magnetic material which exhibits a magnetoresistance effect may be used. For example, a non-magnetic element such as Cu, Ag, Au, Cr, AZ, or Ru or an alloy containing at least one of these elements is used. The thickness of the first magnetic layer 43 is preferably set to be 10 to 100 Å or more.

Soft magnetism means that the direction of a magnetic moment is easily reversed. For example, the magnetism can be represented by the magnitude of the coercive force (Hc) of a ferromagnetic material. That is, when a ferromagnetic material has a small coercive force (Hc), the ferromagnetic material has soft magnetism. In this case, magnetism softer than that of the first magnetic layer 43 means a saturation magnetic field (Hs) smaller than that of the first magnetic layer 43. Since the second magnetic layer 44 has the soft magnetism described above, the second magnetic layer 44 is preferably constituted by a material having soft magnetism formed of a transition metal such as Fe, Co, or Ni or an alloy containing a transition metal. More specifically, the second magnetic layer 44 is preferably formed of a conventionally used soft magnetic material such as a permalloy (about 78.5% Ni, 21.5% Fe, and trace amounts of C, Si, Co, Cu, and Mn); supermalloy (about 79% Ni, 15% Fe, 5% Mo, and 0.5% Mn); and Sendust (about 5% Al, 10% Si, and 85% Fe). The thickness of the second magnetic layer 44 having the soft magnetic properties is preferably set to be about 5 to 1,000 Å, and more preferably, 10 to 200 Å.

Figure 8:
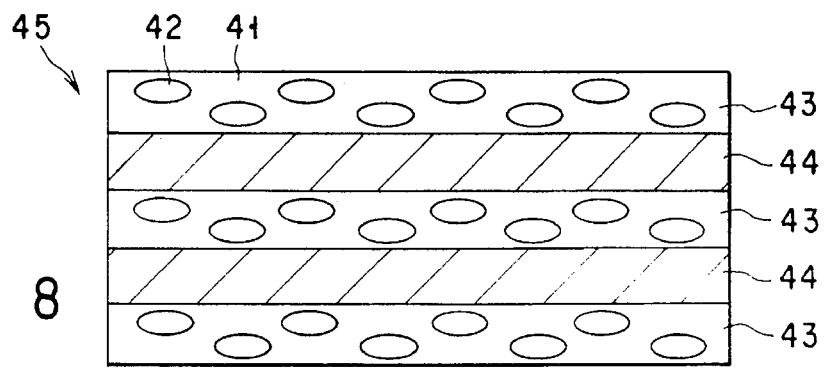

The multilayer 45 is constituted by the first magnetic layer 43 and the second magnetic layer 44 having soft magnetic properties. For example, the second magnetic layer 44 may be formed after the first magnetic layer 43 is formed on a substrate, or the first magnetic layer 43 may be formed after the second magnetic layer 44 is formed. One or a plurality of first magnetic layers 43 may be used. For example, as shown in FIG. 7, the second magnetic layer 44 is interposed between the two first magnetic layers 43. In addition, one or a plurality of second magnetic layers 44 may be used. For example, as shown in FIG. 8, the first magnetic layers 43 and the second magnetic layers 44 may be alternately stacked.

The magnetic moment in the first magnetic layer 43 in which the fine magnetic particles 42 are dispersed may be easily reversed by the interaction between the first magnetic layer 43 and the second magnetic layer 44 having the above soft magnetic properties in which the magnetic moment can be easily reversed. That is, a high sensitivity may be obtained because the magnetic moment of the first magnetic layer can be reversed by a small magnetic field while a high magnetoresistance ratio obtained by the first magnetic layer 43 itself is maintained.

Each of the fine magnetic particles 42 dispersed in the first magnetic layer 43 preferably has a major axis of 50 to 200 Å. The fine magnetic particles 42 preferably have almost zero magnetostriction. As such alloy crystalline permalloy or an alloy having the composition of $(Ni_xFe_yCo_z)_aX_{100-a}$ described above can be used. Each of the fine magnetic particles 42 preferably has a flat shape, and the aspect ratio of each of the fine magnetic particles 42 is preferably set to be about 5 to 50. The first magnetic layer 43 preferably has a uniaxial magnetic anisotropy.

The multilayer typically has a thin-film structure, and can be formed using the thin-film formation technique described above.

Figure 9:
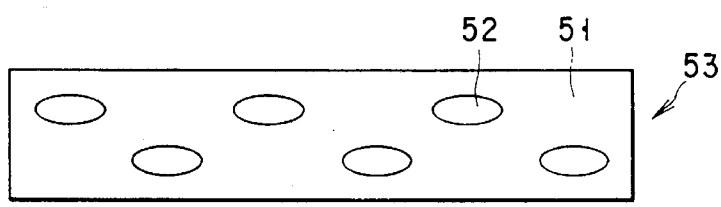
FIG. 9 is a cross-sectional view showing a magnetoresistance effect element according to the sixth embodiment of the present invention.

A magnetoresistance effect element according to the sixth embodiment of the present invention, as shown in FIG. 9, has a magnetic layer 53 in which fine magnetic particles 52 formed of at least two magnetic elements selected from the group consisting of Fe, Co, and Ni are dispersed in a non-magnetic metal matrix 51.

When the present inventors made the studies of a magnetoresistance effect element, the present inventors found the following phenomenon. That is, when fine Co particles in a granular layer in a Cu matrix were partially substituted by Fe, a magnetoresistance effect in a small magnetic field considerably increased. It was found that the above effect could be obtained when fine magnetic particles consisting of at least two magnetic elements selected from the group consisting of Fe, Co, and Ni were used. This embodiment is based on the above findings.

According to this embodiment, as the material of the non-magnetic metal matrix 51, a non-magnetic material which performs a magnetoresistance effect can be used. For example, a non-magnetic element such as Cu, Ag, Au, Cr, Al, or Ru or an alloy containing at least one of these elements is used.

The fine magnetic particles 52 are formed of at least two magnetic elements selected from the group consisting of Fe, Co, and Ni. More specifically, the fine magnetic particles 52 are formed of an Fe—Co alloy, an Fe—Ni alloy, a Co—Ni alloy, or an Fe—Ni—Co alloy.

When the present inventors further made the studies, the present inventors found the following phenomenon. That is, a granular layer in which fine $Co_9Fe$ particles having a magnetostriction constant $\lambda$ which was close to zero were dispersed in a Cu matrix had a saturation magnetic field smaller than that of a granular layer in which fine Co particles having a large magnetostriction constant $\lambda$ were dispersed in a Cu matrix. That is, when the fine magnetic particles 52 consists of a material having a small magnetostriction constant $\lambda$, the saturation magnetic field further decreases. In order to obtain the above effect, the magnetostriction constant $\lambda$ is preferably set to be $10^{-5}$ or less.

Although the thickness of the magnetic layer (granular layer) 53 in which the fine magnetic particles 52 are dispersed in the non-magnetic metal matrix 51 is not limited to a specific value, the thickness is preferably set within a range of 1,000 to 20,000 Å, in the case of a monolayer structure.

The major axis of each of the fine magnetic particles 52 is preferably set to be 50 to 200 Å. In addition, each fine magnetic particle has a flat shape, and the aspect ratio of each fine particle is preferably set to be about 5 to 50. The fine magnetic particles preferably have a uniaxial magnetic anisotropy.

The magnetic layer 53 according to this embodiment typically has a thin-film structure, and can be formed by the thin-film formation technique described above.

EXAMPLES

Examples of the present invention will be described below.

EXAMPLE 1

An $Ag_{75}Co_{21}Zr_{1.5}Nb_{2.5}$ film having a thickness of 1,000 Å was formed on a glass substrate using an ion beam sputter apparatus, an Ag target, and a $Co_{85}Zr_6Nb_9$ target.

Figure 10:
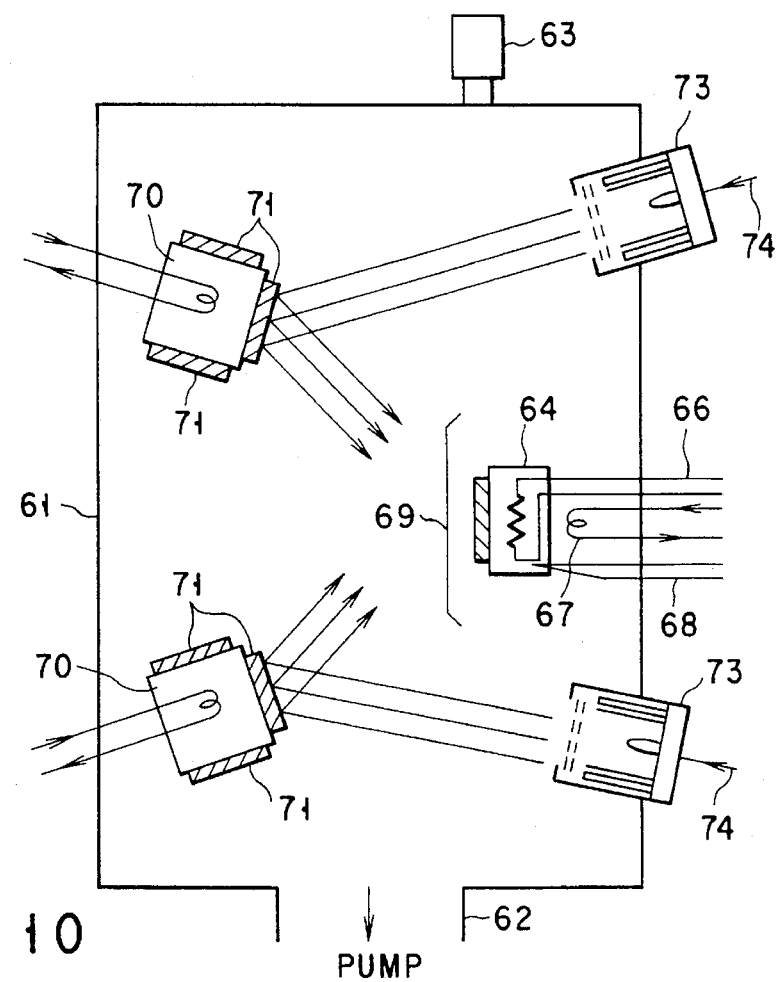
FIG. 10 is a view showing an ion beam sputtering apparatus used in the examples of the present invention.

The ion beam sputtering apparatus used in this case is shown in FIG. 10. An exhaust port 62 of a chamber 61 is connected to a vacuum pump (not shown), and a pressure in the chamber 61 is measured by a pressure gauge 63. A substrate holder 64 is arranged in the chamber 61, and a substrate 65 is held by the substrate holder 64. A heater 66 is arranged in the substrate holder 64, and cooling water 67 flows near the substrate holder 64, so that the temperatures of the substrate holder 64 and the substrate 65 can be controlled. The temperature of the substrate holder 64 is measured by a thermocouple 68. A shutter 69 is arranged in front of the substrate 65. A target holder 70 is rotatably arranged at a position opposing the substrate 65, and a plurality of targets 71 are placed on the surface of the target holder 70. The target holder 70 is cooled by cooling water 72. An ion gun assembly 73 is arranged at a position opposing the target 71, and an Ar gas 74 is supplied to the ion gun assembly 73.

In the above apparatus, the quartz substrate 65 was set in the chamber 61, and the chamber 61 was evacuated to a vacuum of $5\times10^{-7}$ Torr. Thereafter, an Ar gas was supplied into the chamber to a pressure of $1\times10^{-4}$ Torr, and sputtering was performed such that the acceleration voltage of Ar ions to be sputtered was set to be 600 V and a beam current was set to be 30 mA, thereby obtaining a film. This film was annealed at 350° C. for 15 minutes.

When this film was observed with a transmission electron microscope and X-rays, it was confirmed that fine particles formed of an amorphous Co—Zr—Nb alloy were dispersed in an Ag matrix. When a magnetoresistance effect was measured using a four-terminal method, a magnetoresistance ratio was large, i.e., 15%, a saturation magnetic field was very small, i.e., 50 Oe, and hysteresis was small. These results might be obtained due to the following reasons. That is, since the magnetostriction of the amorphous Co—Zr—Nb alloy was very small and the magnetocrystalline anisotropy was essentially zero, soft magnetism could be obtained.

EXAMPLE 2

A (100 Å $Ag_{75}Co_{25}$/30 Å Cu)$_{10}$ multilayer was formed on a glass substrate using an ion beam sputtering method under the same conditions as those in Example 1. The resultant structure was annealed at 350° C. in a vacuum for 15 minutes. When the resultant multilayer was observed with a transmission electron microscope and X-rays, it was observed that the $Ag_{75}Co_{25}$ layer had a structure in which Co flat particles were dispersed in an Ag matrix. When the magnetoresistance effect was measured by a four-terminal method, a magnetoresistance ratio was large, i.e., 15%, a saturation magnetic field was 150 Oe which was smaller than that of a single-layered film. These results might be obtained due to the following reasons. That is, since each precipitated Co particle had a flat shape, demagnetizing field energy decreased, and softer magnetism could be obtained.

EXAMPLE 3

A (100 Å $Ag_{75}Co_{25}$/50 Å Ag)$_{10}$ multilayer was formed on a glass substrate using an ion beam sputtering method under the same conditions as those in Example 1. The resultant structure was annealed at 300° C. in a vacuum for 15 minutes. When the magnetoresistance effect of the resultant multilayer was measured using a four-terminal method, a magnetoresistance ratio was large, i.e., 18%, and a saturation magnetic field considerably decreased to 130 Oe.

EXAMPLE 4

A (100 Å $Ag_{75}Co_{25}$/50 Å Fe)$_{10}$ multilayer was formed on a glass substrate using an ion beam sputtering method under the same conditions as those in Example 1. The resultant structure was annealed at 300° C. in vacuum for 15 minutes. When the magnetoresistance effect of the resultant multilayer was measured using a four-terminal method, a magnetoresistance ratio was large, i.e., 15%, and a saturation magnetic field considerably decreased to 240 Oe.

EXAMPLE 5

A multilayer formed of an alloy layers of Example 1 and Ag layers i.e., a (100 Å $Ag_{75}Co_{21}Zr_{1.5}Nb_{2.5}$/50 Å Ag)$_{10}$ multilayer, was formed on a glass substrate using an ion beam sputtering apparatus. The resultant structure was annealed at 350° C. in a vacuum for 15 minutes. When the resultant multilayer was observed with a transmission electron microscope and X-rays, it was confirmed that the alloy layer had an Ag matrix in which flat particles of an amorphous Co—Zr—Nb alloy were dispersed. When the magnetoresistance effect was measured using a four-terminal method, although a magnetoresistance ratio was 14% which was almost equal to the result obtained in Example 1, a saturation magnetic field was considerably small, i.e., 300 Oe. These results might be obtained due to the following reasons. That is, the magnetostriction of the amorphous Co—Zr—Nb alloy was very small, magnetocrystalline anisotropy was essentially zero, since and each particle had a flat shape, demagnetizing field energy decreased and softer magnetism could be obtained.

EXAMPLE 6

A (25 Å $Co_9Fe$/40 Å $Ag)_{10}$ multilayer was formed on a glass substrate using an ion beam sputtering apparatus under the same conditions as those in Example 1. The resultant structure was annealed at 320° C. in a vacuum for 15 minutes. When the resultant multilayer was observed with a transmission electron microscope and X-rays, it was confirmed that the multilayer was constituted by a films in which flat $Co_9Fe$ alloy particles were dispersed in an Ag matrix and an Ag films. The film having the Ag matrix in which the $Co_9Fe$ alloy particles were dispersed might be formed such that Ag atoms were diffused in a $Co_9Fe$ layer by annealing. The size of each $Co_9Fe$ alloy particle was about 150 Å. When the magnetoresistance effect was measured using a four-terminal method, it was confirmed that a annealing. The size of each $Ni_{80}Fe_{20}$ alloy particle was about 200 Å. When the magnetoresistance effect was measured using a four-terminal method, it was confirmed that a magnetoresistance ratio was large, i.e., 5%, and a saturation magnetic field was small, i.e., 10 Oe.

EXAMPLE 8

Cu—Co alloy films were formed on glass substrates and an MgO (110) substrate using the ion beam sputtering apparatus shown in FIG. 10 under the conditions shown in Table 1, respectively.

The chamber was evacuated to a degree of vacuum of $5 \times 10^{-7}$ Torr, and an Ar gas was supplied into the chamber to a partial pressure of $1 \times 10^{-4}$ Torr. Co and Cu were prepared as targets, and were Co-sputtered to form an alloy film. When power supplied to the Co and Cu was changed to control the composition ratio of Co to fall within a range of 10 to 20 atm %. The substrate temperatures were set to be room temperature and 300° C. When a heated substrate was used, permanent magnets were arranged on both the sides of the substrate, and film formation was performed between the magnets. Some films formed at room temperature were annealed at 300° C. in a hydrogen atmosphere while a magnetic field was applied to these films. Each of the obtained films was etched to have a 1 mm×1 cm rectangular shape, and the magnetoresistance effect of the film was measured by a DC four-terminal method. The values of an applied magnetic field $H_{10}\%$ obtained when a magnetoresistance ratio of 10% is obtained are shown in Table 1.

TABLE 1

| Sample No. | Substrate | Substrate Temperature (°C.) | Magnetic Field in Film Formation | Annealing After Film Formation | Magnetic Field in Annealing | $H_{10}\%$ (Oe) |
|---|---|---|---|---|---|---|
| 1 | Glass | Room temperature | Absence | Presence | Presence | 6200 (No anisotropy) |
| 2 | Glass | 300 | Presence | Absence | — | 8100 (No anisotropy) |
| 3 | Glass | Room temperature | Absence | Presence | Presence | 28 (Direction of axis of easy magnetization) |
| 4 | Glass | 300 | Presence | Absence | — | 37 (Direction of axis of easy magnetization |
| 5 | Mgo (110) | Room temperature | Absence | Presence | Absence | 15 (Direction of axis of easy magnetization) | magnetoresistance ratio was large, i.e., 18%, and a saturation magnetic field was small, i.e., 50 Oe.

EXAMPLE 7

A (25 Å $Ni_{80}Fe_{20}$/40 Å $Ag)_{10}$ multilayer was formed on a glass substrate using an ion beam sputtering apparatus under the same conditions as those in Example 1. The resultant structure was annealed at 320° C. in a vacuum for 15 minutes. When the resultant multilayer was observed with a transmission electron microscope and X-rays, it was confirmed that the multilayer was constituted by a films in which flat $Ni_{80}Fe_{20}$ alloy particles were dispersed in an Ag matrix and an Ag films. The film in which the $Ni_{80}Fe_{20}$ alloy particles were dispersed in the Ag matrix might be formed such that Ag atoms were diffused in an $Ni_{80}Fe_{20}$ layer by In a film having no magnetic anisotropy and formed on a glass substrate without forming a magnetic field, or in a film having no magnetic anisotropy, formed on a glass substrate, and annealed without forming a magnetic field, the value of $H_{10}\%$ was large, i.e., 6 kOe or more. When film formation on a monocrystalline substrate, film formation in a magnetic field, or heat-treating in a magnetic field was performed, the value of $H_{10\%}$ which was measured in the direction of the axis of easy magnetization decreased. Therefore, it was understood that the effect of uniaxial magnetic anisotropy was obtained. In particular, when a film was formed on a monocrystalline substrate, the effect could was enhanced.

EXAMPLE 9

A sample of a magnetoresistance effect element having a multilayer constituted by a granular layer and a softmagnetic layer and a comparative sample were formed using the ion beam sputtering apparatus shown in FIG. 10. After the chamber was evacuated to a degree of vacuum of $4 \times 10^{-7}$ Torr, an Ar gas (purity: 99.99%) was supplied to an ion gas to a partial pressure of $1.3 \times 10^{-4}$ Torr to form Ar ions, and the Ag ions was radiated on targets as an ion beam having an acceleration voltage of 700 V and a beam current of 30 mA. Three metals were prepared as these targets: Co serving as a magnetic metal for forming fine magnetic particles; Cu serving as a non-magnetic metal for forming a non-magnetic matrix; and Fe serving as a magnetic metal for forming a softmagnetic layer. These targets were Co-sputtered using two ion gun assemblies. First, a Co (20 atm %) —Cu layer was formed to have a thickness of $2,000^2$, and an Fe layer (thickness: 50 Å) was formed, thereby forming a sample (sample 1). A Co (20 atm %) —Cu layer was formed to have a thickness of 2,000 Å, and no Fe layer was formed, thereby forming a comparative example (sample 2). In this case, an $SiO_2$ substrate was used as a substrate, and a substrate temperature was set to be room temperature. After these films were formed, they were annealed in a vacuum of $5 \times 10^{-7}$ Torr at 240° C. for 30 minutes.

In each sample of the magnetoresistance effect element formed as described above, a magnetoresistance effect with respect to an external magnetic field was measured by a conventional four-terminal method.

Figure 11:
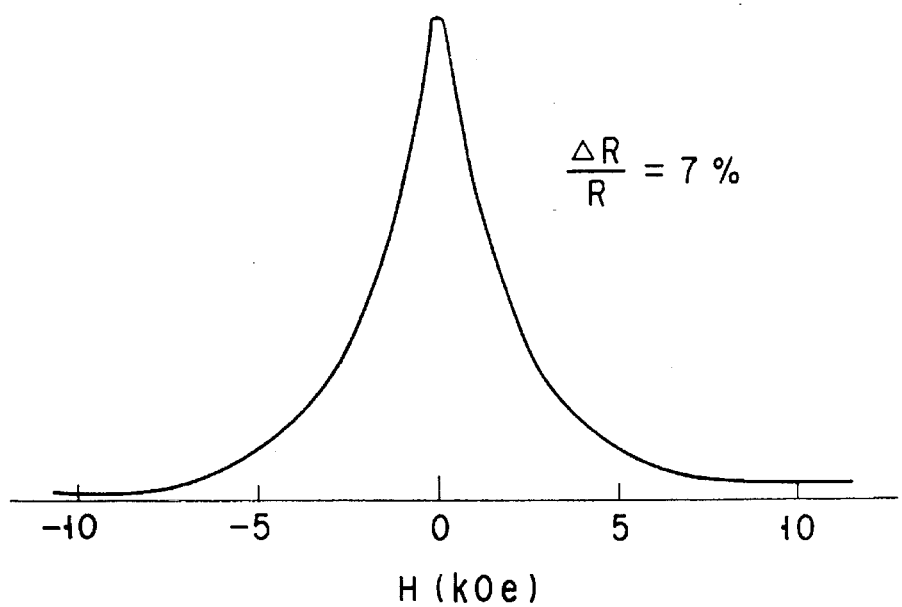
FIG. 11 is a graph showing the magnetoresistance ratio of a sample of a magnetoresistance effect element according to Example 9 of the present invention.
Figure 12:
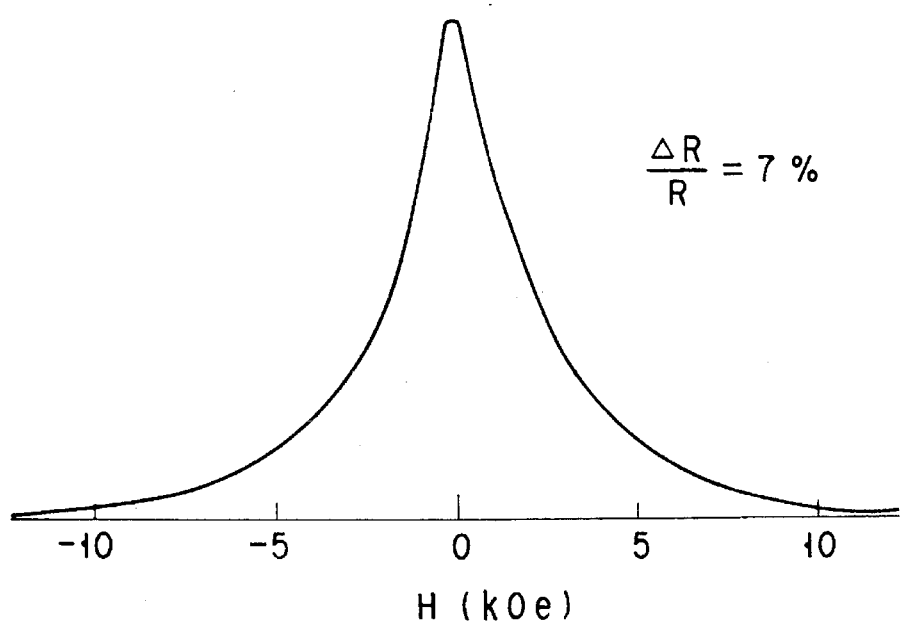
FIG. 12 is a graph showing the magnetoresistance ratio of a sample of the magnetoresistance effect element used as a comparative sample in Example 9.

FIGS. 11 and 12 respectively show influences of the magnetoresistance ratios (AR/Rs) of samples 1 and 2 with respect to an external magnetic field (H). As is apparent from FIGS. 11 and 12, although the comparative example having no softmagnetic layer has a magnetoresistance ratio ($\Delta R/Rs$) of 7% and a saturation magnetic field (Hs) of 10 kOe or more, sample 1 has a magnetoresistance ratio ($\Delta R/Rs$) of 7% and a saturation magnetic field (Hs) of about 7 kOe or more. Therefore, it is found that the saturation magnetic field of sample 1 considerably decreases while the magnetoresistance ratio is rarely changed. In this manner, it was confirmed that a preferable magnetoresistance effect could be obtained by arranging a softmagnetic layer. When the other sample measured in the same manner as described above, the same effect as described above could be obtained.

Samples in which the thicknesses of a softmagnetic layer and a granular film were changed were formed, and the magnetoresistance effect of the samples were measured. In this case, the same effect as described above could be obtained.

EXAMPLE 10

An example obtained by using an 80 wt % Ni-20 wt % Fe alloy (permalloy as the material of a softmagnetic layer and a Co (25 atm %) —Ag alloy as the material of a granular film in a method which is almost the same as that of Example 9 will be described below.

Co and Ag targets were Co-sputtered using the ion beam sputtering apparatus shown in FIG. 10 and two gun assemblies, a Co (25 arm %) —Ag film was formed on a substrate to have a thickness of 3,000 Å, the resultant structure was annealed at 420° C. in a vacuum of $5 \times 10^{-7}$ Torr for 30 minutes, and an 80 wt % Ni-20 wt % Fe (permalloy) layer was formed on the resultant structure to have a thickness of 50 Å, thereby forming sample 3. Sample 4 which had no permalloy film was formed.

Figure 13:
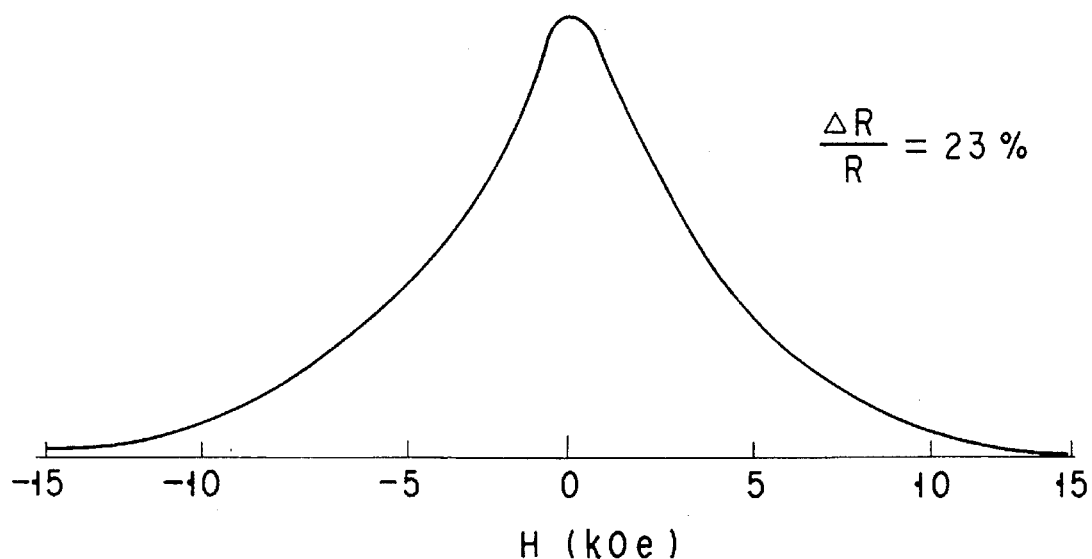
FIG. 13 is a graph showing the magnetoresistance of a sample of a magnetoresistance effect element according to Example 10.
Figure 14:
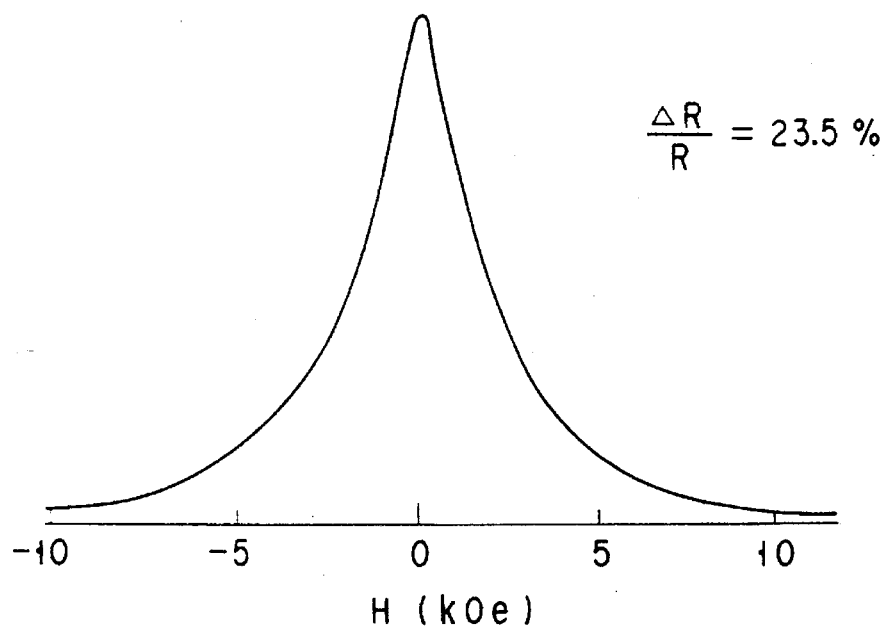
FIG. 14 is a graph showing the magnetoresistance ratio of a sample of a magnetoresistance effect element used as a comparative example in Example 10.

The magnetoresistance ratio of sample 4 is shown in FIG. 13, and the magnetoresistance ratio of sample 3 is shown in FIG. 14. As is apparent from FIGS. 13 and 14, although the comparative sample having no softmagnetic layer has a magnetoresistance ratio of 23% and a saturation magnetic field of about 13 kOe, sample 3 has, as shown in FIG. 14, a magnetoresistance ratio of 23.5% and a saturation magnetic field of about 8 kOe. Therefore, it is found that the saturation magnetic field of sample 3 considerably decreases while the magnetoresistance ratio rarely changes. In this manner, it was confirmed that a preferable magnetoresistance effect could be obtained by arranging a softmagnetic layer. When samples in which the thicknesses of a softmagnetic layer and a granular film were changed were formed, and the magnetoresistance effect of the samples was measured, the same effect as described above could be obtained.

EXAMPLE 11

In this example, $Fe_1Co_9$ was used as the material of fine magnetic particles, Cu was used as the material of a non-magnetic metal matrix, and a granular film was formed by Co-sputtering $Fe_1Co_9$ and Cu using the ion beam sputtering apparatus shown in FIG. 10.

The chamber was evacuated to a degree of vacuum of $5 \times 10^{-7}$ Torr, an Ar gas was supplied into the chamber to a pressure of $1.3 \times 10^{-4}$ torr, and sputtering was performed under the conditions of 700 V and 300 mA. An $Fe_1Co_9$ alloy film and a Cu film were prepared as targets, and these films were simultaneously stacked on a quartz substrate to form an $Fe_1Co_9$ (20 atm %) —Cu granular film. After this film was formed to have a thickness of 3,000 Å, and the film was annealed at 430° C. in a vacuum of $50 \times 10^{-7}$ Torr for 10 minutes.

The magnetoresistance effect of this sample was measured by a conventional four-terminal method. A magnetoresistance ratio obtained as the measurement result is shown in FIG. 15. For comparison, the magnetoresistance ratio of a Co (20 atm %) —Cu granular film formed using Co as the material of fine particles and Cu as the material of a non-magnetic matrix under the same conditions as described above is shown in FIG. 16.

When an $Fe_1Co_9$ alloy was used as the material of the fine magnetic particles, it was confirmed that a large magnetoresistance ratio of 8.0% was obtained and characteristics suitable for a magnetoresistance effect element exhibited.

EXAMPLE 12

In this example, $Fe_2Co_8$ was used as the material of fine magnetic particles, Cu was used as the material of a non-magnetic metal matrix, and these materials were Co-sputtered by the ion beam sputter apparatus shown in FIG. 10 under the same film formation conditions as those of Example 9, thereby forming a $Fe_2Co_8$—Cu (20 atm %) granular film.

Figure 17:
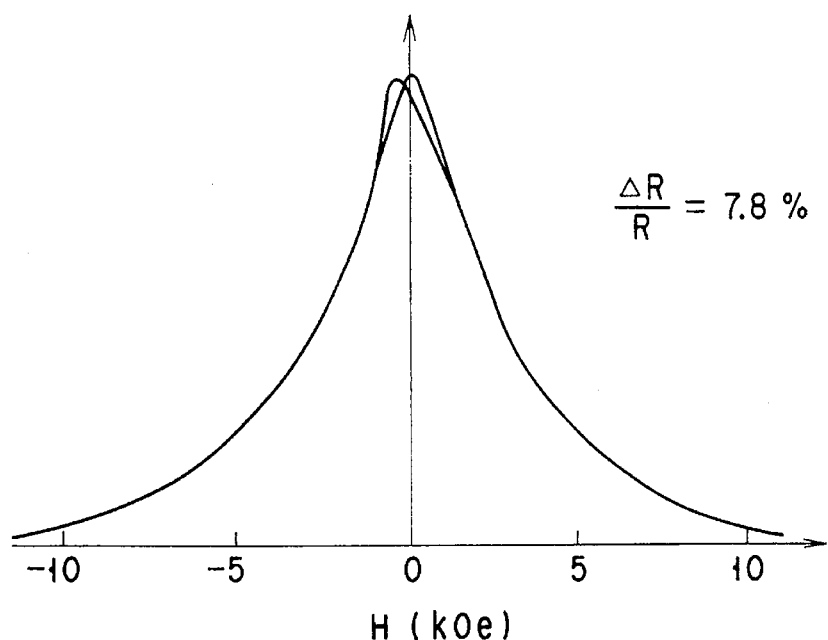
FIG. 17 is a graph showing the magnetoresistance ratio of a sample of a magnetoresistance effect element according to Example 12.

The magnetoresistance ratio of this sample is shown in FIG. 17. When an $Fe_2Co_8$ alloy was used as the material of the fine magnetic particles, a large magnetoresistance ratio of 7.8% could be obtained, and characteristics suitable for a magnetoresistance effect element exhibited.

EXAMPLE 13

In this example, $Fe_1Co_9$ was used as the material of fine magnetic particles, Ag was used as the material of a non-magnetic metal matrix, and these materials were simultaneously sputtered by the ion beam sputter apparatus shown in FIG. 10 under the same film formation conditions as those of Example 11, thereby forming a $Fe_1Co_9$ (20 atm %) —Ag granular film.

Although the film formation conditions were the same as those of Example 11 as described above, an annealing temperature was set to be 350° C. which was different from the annealing temperature in Example 11. Note that a substrate having an Si base and an oxide film formed on the Si base and having a thickness of about 1,000 Å was used.

Figure 18:
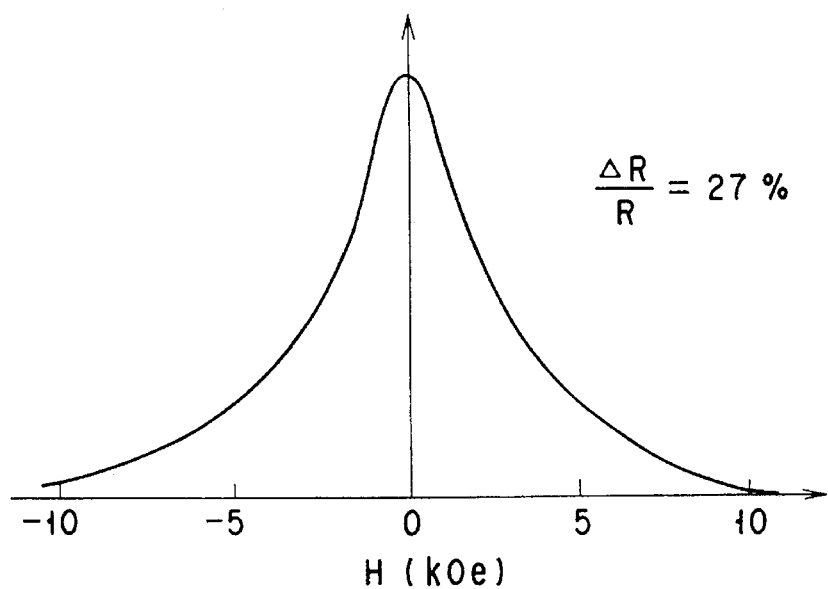
FIG. 18 is a graph showing the magnetoresistance ratio of a sample of a magnetoresistance effect element according to Example 13.
Figure 19:
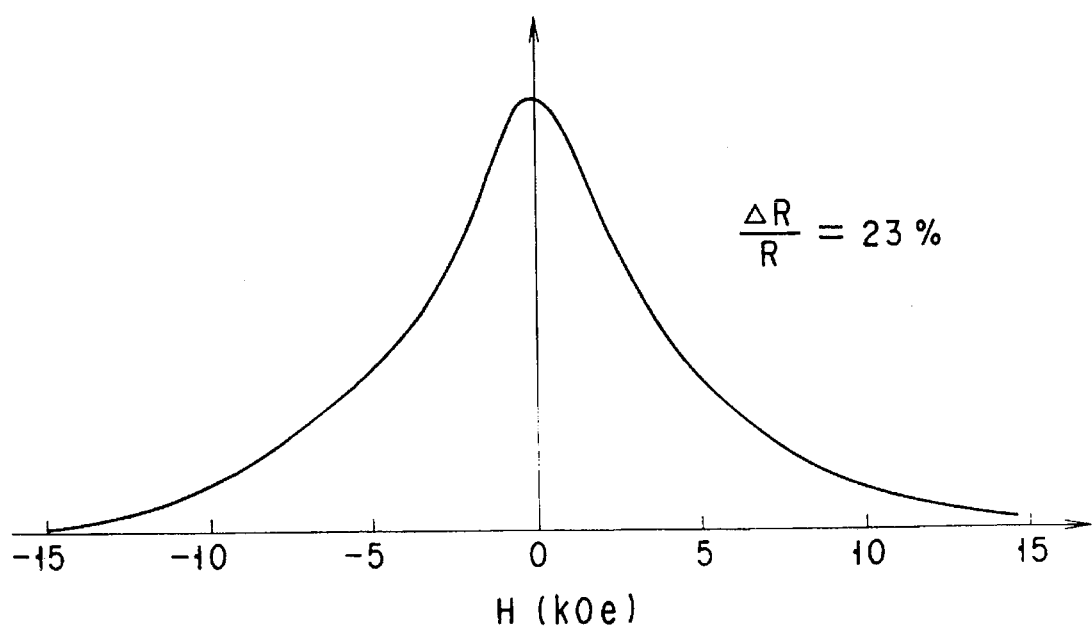
FIG. 19 is a graph showing the magnetoresistance ratio of a sample of a magnetoresistance effect element used as a comparative example in Example 13.

The magnetoresistance ratio of this sample is shown in FIG. 18. Note that Co (20 atm %) —Ag granular film was formed as a comparative example under the same conditions as described above. A result obtained by measuring the magnetoresistance ratio of the comparative sample is shown in FIG. 19.

As a result, when an $Fe_1Co_9$ alloy was used as the material of the fine magnetic particles, a magnetoresistance ratio of 27% which was larger than that of the comparative example could be obtained, and the saturation magnetic field of the sample was smaller than that of the comparative example. That is, when the $Fe_1Co_9$ alloy was used as the material of the fine magnetic particles, it was confirmed that characteristics suitable for a magnetoresistance effect element exhibited.

EXAMPLE 14

In this example, $Fe_{25}Co_{75}$ was used as the material of magnetic particles, Ag was used as the material of a non-magnetic metal matrix, and a $Fe_{25}Co_{75}$ (20 atm %) —Ag granular film was formed by the ion beam sputtering apparatus shown in FIG. 10 under the same conditions as those of Example 13, which conditions included annealing conditions. Note that, as a substrate, an Si (100) monocrystalline substrate was used.

Figure 20:
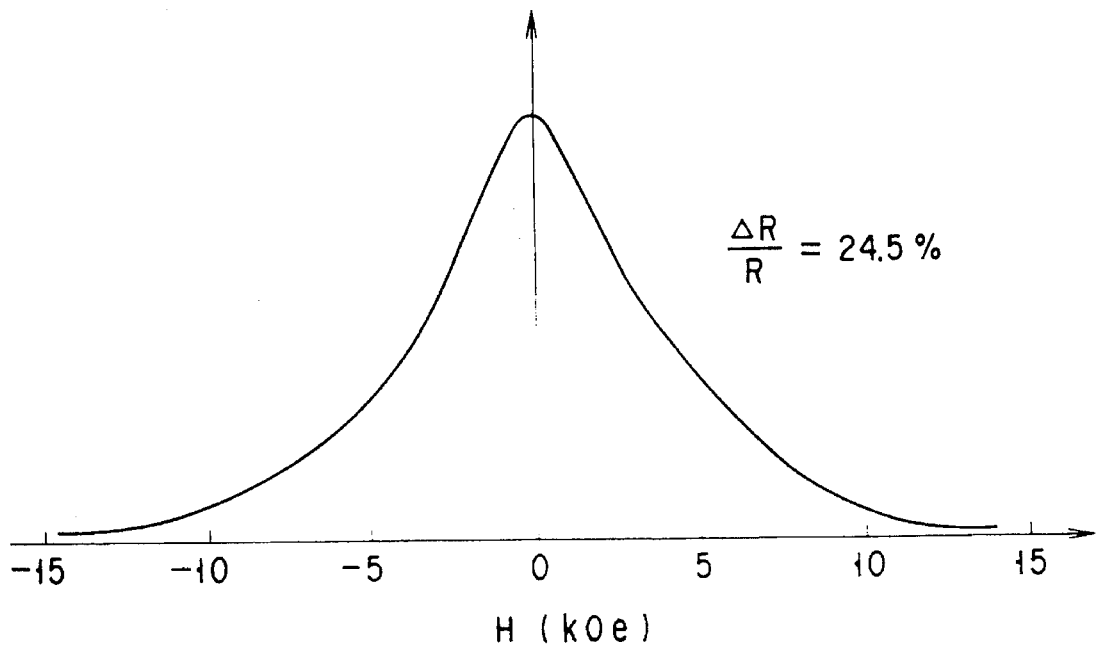
FIG. 20 is a graph showing the magnetoresistance ratio of a sample of a magnetoresistance effect element according to Example 14.

The magnetoresistance ratio of this sample is shown in FIG. 20. When an $Fe_{25}Co_{75}$ alloy was used as the material of the fine magnetic particles, the followings were confirmed. That is, a relatively small saturation magnetic field could be obtained, a large magnetoresistance ratio of 24.5% could be obtained, and characteristics suitable for a magnetoresistance effect element exhibited.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A multilayer magnetoresistance effect element comprising one magnetic layer in which flat-shaped magnetic metal particles having an aspect ratio within the range of 5 to 50, a major axis of not more than 200 Å, and containing at least one element selected from the group consisting of Fe, Co, and Ni are dispersed in a matrix containing at least one element selected from the group consisting of noble metals and Cu, and at least one non-magnetic layer containing a metal selected from the group consisting of noble metals and Cu.

2. The multilayer element according to claim 1, wherein the magnetic metal particles are crystalline or amorphous.

3. The multilayer element according to claim 1, wherein the magnetic metal particles have substantially zero magnetostriction.

4. The multilayer element according to claim 3, wherein the magnetic metal particles are crystalline having an alloy composition consisting of about 78.5% Ni, 21.5% Fe, and trace amounts of C, Si, CO, Cu, and Mn.

5. The multilayer element according to claim 4, wherein the magnetic metal particles have a composition represented by $(Ni_xFe_yCo_z)_aX_{100-a}$, where $x=0$–$0.10$, $y=0.04$–$0.10$, $z=0.90$–$0.94$, $x+y+z=1$, $a=65$–$90$, and X is at least one of the elements selected from the group consisting of Nb, Zr, Hf, Si, B, C and P.

6. The multilayer element according to claim 1, wherein each of the magnetic metal particles has a major axis within a range of 50 to 200 Å.

7. The multilayer element according to claim 1, wherein the noble metal matrix contains at least one element selected from the group consisting of Cu, Ag, and Au.

8. The multilayer element according to claim 1, wherein the magnetic metal particles are induced with a uniaxial anisotropy.

9. The multilayer element according to claim 1, wherein said non-magnetic layer contains at least one element selected from the group consisting of Cu, Ag, and Au.

10. The multilayer element according to claim 1, wherein said magnetic layer has a thickness of 5 to 200 Å.

11. The multilayer element according to claim 1, wherein said non-magnetic layer has a thickness of 10 to 100 Å.

12. A multilayer magnetoresistance effect element according to claim 1, comprising at least one first magnetic layer and at least one second magnetic layer, said second magnetic layer having a saturation magnetic field smaller than that of said first magnetic layer.

13. A multilayer magnetoresistance effect element comprising one first magnetic layer in which flat-shaped magnetic metal particles having an aspect ratio within the range of 5 to 50, a major axis of not more than 200 Å, and containing at least one element selected from the group consisting of Fe, Co, and Ni are dispersed in a matrix containing at least one element selected from the group consisting of noble metals and Cu, and at least one second magnetic layer containing at least one element selected from the group consisting of Fe, Co, and Ni.

14. The multilayer element according to claim 13, wherein the magnetic metal particles are crystalline or amorphous.

15. The multilayer element according to claim 13, wherein the magnetic metal particles have substantially zero magnetostriction.

16. The multilayer element according to claim 15, wherein the magnetic metal particles are crystalline having an alloy consisting essentially of about 78.5% Ni, 21.5% Fe, and trace amounts of C, Si, Co, Cu, and Mn.

17. The multilayer element according to claim 15, wherein the magnetic metal particles have a composition represented by $(Ni_xFe_yCo_z)_aX_{100-a}$, where $x=0$–$0.10$, $y=0.04$–$0.10$, $z=0.90$–$0.94$, $x+y+z=1$, $a=65$–$90$, and X is at least one of the elements selected from the group consisting of Nb, Zr, Hf, Si, B, C and P.

18. The multilayer element according to claim 13, wherein each of the magnetic metal particles has a major axis falling within a range of 50 to 200 Å.

19. The multilayer element according to claim 13, wherein the noble metal matrix contains at least one element selected from the group consisting of Cu, Ag, and Au.

20. The multilayer element according to claim 13, wherein the magnetic metal particles are induced with a uniaxial anisotropy.

21. The multilayer element according to claim 13, wherein said at least one first magnetic layer has a thickness of 5 to 200 Å.

22. The multilayer element according to claim 15, wherein said at least one second magnetic layer has a thickness of 20 to 300 Å.

23. A multilayer magnetoresistance effect element according to claim 13, wherein said at least one second magnetic layer has a saturation magnetic field smaller than that of said at least one first magnetic layer.

24. The multilayer element according to claim 23, wherein the non-magnetic metal matrix of said at least one first magnetic layer contains at least one element selected from the group consisting of Cu, Ag, Au, Cr, Al, and Ru.

25. The multilayer element according to claim 23, wherein said at least one second magnetic layer contains one of a transition metal and an alloy containing a transition metal.

26. The multilayer element according to claim 25, wherein said at least one second magnetic layer is formed by one alloy selected from the group consisting of an alloy consisting essentially of about 78.5% Ni, 21.5% Fe, and trace amounts of C, Si, Co, Cu, and Mn, an alloy consisting essentially of 79% Ni, 15% Fe, 5% Mo and 0.5% Mn, and an alloy consisting essentially of 5% Al, 10% Si, and 85% Fe.

27. The multilayer element according to claim 23, wherein said at least one first magnetic layer has a thickness of 10 to 100 Å.

28. The multilayer element according to claim 23, wherein said at least one second magnetic layer has a thickness of 5 to 1,000 Å.

29. The multilayer element according to claim 23, comprising a plurality of first magnetic layers.

30. The multilayer element according to claim 29, comprising a plurality of second magnetic layers.

31. The multilayer element according to claim 30, wherein said plurality of first magnetic layers and plurality of second magnetic layers are alternately stacked.

32. The multilayer element according to claim 23, wherein the magnetic metal particles have substantially zero magnetostriction.

33. The multilayer element according to claim 23, wherein each of the magnetic metal particles has a major axis within a range of 50 to 200 Å.

34. The multilayer element according to claim 23, wherein the magnetic metal particles are induced with a uniaxial anisotropy.

* * * * *